(12) United States Patent
Lo et al.

(10) Patent No.: US 11,569,150 B2
(45) Date of Patent: Jan. 31, 2023

(54) SEMICONDUCTOR BONDING PAD DEVICE AND METHOD FOR FORMING THE SAME

(71) Applicant: Winbond Electronics Corp., Taichung (TW)

(72) Inventors: Hsi-Kai Lo, Taichung (TW); Ming-Hung Lai, Taichung (TW)

(73) Assignee: WINBOND ELECTRONICS CORP., Taichung (TW)

(*) Notice: Subject to any disclaimer, the term of this patent is extended or adjusted under 35 U.S.C. 154(b) by 218 days.

(21) Appl. No.: 17/099,129

(22) Filed: Nov. 16, 2020

(65) Prior Publication Data
US 2021/0159150 A1     May 27, 2021

(30) Foreign Application Priority Data

Nov. 21, 2019   (TW) ................... 108142257

(51) Int. Cl.
*H01L 23/482*   (2006.01)
*H01L 21/02*    (2006.01)
(Continued)

(52) U.S. Cl.
CPC ...... *H01L 23/482* (2013.01); *H01L 21/02164* (2013.01); *H01L 21/31116* (2013.01); *H01L 21/76841* (2013.01); *H01L 23/53204* (2013.01)

(58) Field of Classification Search
CPC ....... H01L 23/482; H01L 24/03; H01L 24/05; H01L 21/02164; H01L 21/76802; H01L 21/76841; H01L 21/31116; H01L 23/53204; H01L 21/32134; H01L 21/76834; H01L 2224/0381;
(Continued)

(56) References Cited

U.S. PATENT DOCUMENTS 3,847,687 A * 11/1974 Davidsohn .............. H01L 21/00
                                                  148/DIG. 115
5,342,801 A *  8/1994 Perry ................. H01L 21/32137
                                                  257/E21.252
(Continued)

FOREIGN PATENT DOCUMENTS

CN    104900481 A  *  9/2015    ......... H01L 21/3065
CN    104900481 A     9/2015
(Continued)

*Primary Examiner* — Allen L Parker
*Assistant Examiner* — David W Houston, III
(74) *Attorney, Agent, or Firm* — Muncy, Geissler, Olds & Lowe, P.C.

(57) ABSTRACT

A method for forming a semiconductor device is provided. The method includes the following steps: providing a semiconductor substrate; forming a pad layer on the semiconductor substrate; forming a first passivation layer on the pad layer; forming a second passivation layer on the first passivation layer, wherein the second passivation layer comprises polycrystalline silicon; forming an oxide layer on the second passivation layer; forming a nitride layer on the oxide layer; removing a portion of the oxide layer and a portion of the nitride layer to expose a portion of the second passivation layer; removing the portion of the second passivation layer that has been exposed to expose a portion of the first passivation layer; and removing the portion of the first passivation layer that has been exposed to expose a portion of the pad layer.

14 Claims, 7 Drawing Sheets

(51) Int. Cl.
  *H01L 23/532* (2006.01)
  *H01L 21/768* (2006.01)
  *H01L 21/311* (2006.01)

(58) Field of Classification Search
  CPC ......... H01L 21/02063; H01L 21/32137; H01L
       2224/05647; H01L 21/76814; H01L
       2224/02166; H01L 21/32136; H01L
       21/76832; H01L 2224/05684; H01L
       2224/05624; H01L 2924/00014
  USPC ........................................................ 257/763
  See application file for complete search history.

(56) References Cited

U.S. PATENT DOCUMENTS

| | | | | |
|---|---|---|---|---|
| 5,384,281 | A * | 1/1995 | Kenney | H01L 21/76831 257/E21.507 |
| 6,448,117 | B1 * | 9/2002 | Jen | H01L 29/78633 257/E29.147 |
| 9,556,017 | B2 * | 1/2017 | Chen | H01L 21/00 148/DIG. 115 |
| 10,032,640 | B1 * | 7/2018 | Huang | H01L 21/00 148/DIG. 115 |
| 2001/0055731 | A1 * | 12/2001 | Irie | G03F 7/38 430/324 |
| 2002/0036183 | A1 * | 3/2002 | Shibata | H01L 21/0271 216/99 |
| 2004/0072446 | A1 * | 4/2004 | Liu | H01L 29/66636 438/719 |
| 2007/0238304 | A1 * | 10/2007 | Wu | H01L 27/11521 438/585 |
| 2008/0290368 | A1 * | 11/2008 | Rubin | H01L 31/022441 136/255 |
| 2009/0191697 | A1 * | 7/2009 | Lee | H01L 27/11521 438/585 |
| 2010/0101849 | A1 * | 4/2010 | Sunohara | H01L 31/022441 136/255 |
| 2011/0056545 | A1 * | 3/2011 | Ji | H01L 31/022441 136/255 |
| 2014/0006191 | A1 | 3/2014 | Lee et al. | |
| 2015/0275361 | A1 * | 10/2015 | Lubomirsky | H01L 21/00 148/DIG. 115 |
| 2019/0096831 | A1 * | 3/2019 | Su | H01L 21/00 148/DIG. 115 |

FOREIGN PATENT DOCUMENTS

| | | | |
|---|---|---|---|
| JP | 2010506385 A * | 2/2010 | |
| KR | 100200234 B1 * | 6/1999 | |
| TW | 201906001 A | 2/2019 | |
| WO | WO-0101468 A1 * | 1/2001 | ......... H01L 21/3065 |

\* cited by examiner

SEMICONDUCTOR BONDING PAD DEVICE AND METHOD FOR FORMING THE SAME

CROSS REFERENCE TO RELATED APPLICATIONS

This application claims priority of Taiwan Patent Application No. 108142257, filed on Nov. 21, 2019, the entirety of which is incorporated by reference herein.

BACKGROUND

Technical Field

The present disclosure relates to a semiconductor device and a method for forming the same, and more particularly to a pad layer of the semiconductor device and a method for forming the same.

Description of the Related Art

The semiconductor integrated circuit industry has experienced rapid growth. The development of integrated circuit design and materials technology has produced integrated circuits for several generations, each of which has smaller and more complex circuits than the previous generation. Integrated circuits are widely used in consumer electronics, such as personal computers, smartphones, or tablet computers.

Generally, semiconductor integrated circuit devices have a pad structure that is electrically connected to external electronic components. The pad structure is usually exposed to the environment for a period of time before the packaging process is completed. Therefore, if there are chemical substances left on the pad structure during the manufacturing process, the chemical substances may react with the air or water vapor in the environment, which will be more likely to cause oxidation or corrosion of the pad structure, and thereby reduce the yield of the final product.

Although the currently existing methods of forming the pad structure have been adequate for their intended purposes, they have not been entirely satisfactory in all respects. Therefore, the development of a process that can further improve the yield of the pad structure is still one of the topics that the industry is aiming at.

SUMMARY

In accordance with some embodiments of the present disclosure, a method for forming a semiconductor device is provided. The method for forming a semiconductor device includes the following steps: providing a semiconductor substrate; forming a pad layer on the semiconductor substrate; forming a first passivation layer on the pad layer; forming a second passivation layer on the first passivation layer, wherein the second passivation layer comprises polycrystalline silicon; forming an oxide layer on the second passivation layer; forming a nitride layer on the oxide layer; removing a portion of the oxide layer and a portion of the nitride layer to expose a portion of the second passivation layer; removing the portion of the second passivation layer that has been exposed to expose a portion of the first passivation layer; and removing the portion of the first passivation layer that has been exposed to expose a portion of the pad layer.

In accordance with some embodiments of the present disclosure, a semiconductor device is provided. The semiconductor device includes a semiconductor substrate, a pad layer, a first passivation layer, a second passivation layer, an oxide layer, and a nitride layer. The pad layer is disposed on the semiconductor substrate. The first passivation layer is disposed on the pad layer, and the second passivation layer is disposed on the first passivation layer. The second passivation layer includes polycrystalline silicon. The oxide layer is disposed on the second passivation layer, and the nitride layer is disposed on the oxide layer. In addition, the semiconductor device further includes an opening that penetrates the first passivation layer, the second passivation layer, the oxide layer, and the nitride layer, and the opening exposes a top surface of the pad layer.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
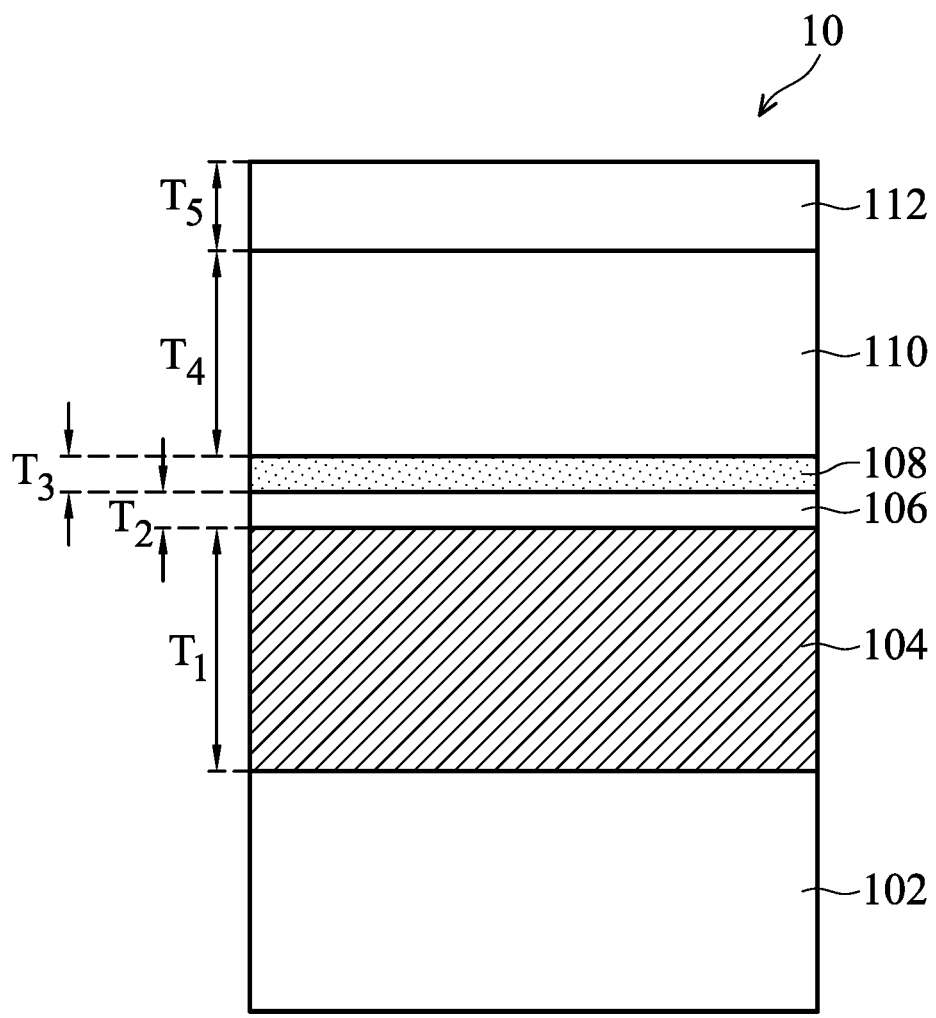
FIGS. 1A to 1G are cross-sectional diagrams of a semiconductor device during various stages of manufacture in accordance with some embodiments of the present disclosure.

The method for forming a semiconductor device and a semiconductor device formed by such a method are described in detail below. It should be understood that the specific elements and configurations described in the following detailed description are set forth in order to clearly describe the present disclosure. It will be apparent that the exemplary embodiments set forth herein are used merely for the purpose of illustration.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure. In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

The terms "about" and "substantially" typically mean +/−10% of the stated value, or +/−5% of the stated value. The stated value of the present disclosure is an approximate value. When there is no specific description, the stated value includes the meaning of "about" or "substantially".

In accordance with to some embodiments of the present disclosure, the method for forming the semiconductor device includes forming a passivation layer including polycrystalline silicon on a pad layer, which serve as an etch stop layer. In addition, in accordance with some embodiments of the present disclosure, in the method for forming the semiconductor device, the etching process for removing the passivation layer does not use a fluorine-containing gas. The chemical substances that are left in the etching process to react with the pad layer may be reduced, and therefore the problem of corrosion of the pad layer may be reduced.

Accordingly, the yield of the pad layer as a topmost metal layer can be effectively improved.

FIGS. 1A to 1G are cross-sectional diagrams of a semiconductor device 10 during various stages of manufacture in accordance with some embodiments of the present disclosure. It should be understood that additional operations may be provided before, during, and/or after the method for forming the semiconductor device 10. In accordance with some embodiments, some of the stages described below may be replaced or deleted. In accordance with some embodiments, additional features may be added to the semiconductor device 10. In accordance with some embodiments, some features of the semiconductor device 10 described below may be replaced or deleted.

In accordance with some embodiments, the semiconductor device 10 may include a memory structure, for example, a volatile memory or a nonvolatile memory such as a flash memory, but the present disclosure is not limited thereto.

Referring to FIG. 1A, first, a semiconductor substrate 102 may be provided. In some embodiments, suitable semiconductor elements may have been formed in the semiconductor substrate 102. For example, the semiconductor substrate 102 may include a transistor element, a capacitor element and so on.

Next, a pad layer 104 may be formed on the semiconductor substrate 102, and the pad layer 104 may serve as a top metal layer electrically connected to external electronic components. In some embodiments, the pad layer 104 may include a metal conductive material, such as aluminum (Al), copper (Cu), tungsten (W), aluminum alloy, copper alloy, tungsten alloy, or a combination thereof, but it is not limited thereto.

Furthermore, the pad layer 104 may have a thickness $T_1$. In some embodiments, the thickness $T_1$ of the pad layer 104 may be in a range from about 600 nm to about 1200 nm, or from about 700 nm to about 1000 nm, e.g., about 800 nm.

As shown in FIG. 1A, a first passivation layer 106 then may be formed on the pad layer 104. The first passivation layer 106 may protect the pad layer 104 and slow down the oxidation rate of the pad layer 104, or reduce the phenomenon of electron migration. In some embodiments, the material of the first passivation layer 106 may include titanium nitride (TiN), but it is not limited thereto.

Furthermore, the first passivation layer 106 may have a thickness $T_2$. In some embodiments, the thickness $T_2$ of the first passivation layer 106 may be in a range from about 20 nm to about 100 nm, or from about 30 nm to about 60 nm, e.g., about 40 nm, or about 50 nm.

Next, a second passivation layer 108 may be formed on the first passivation layer 106. The second passivation layer 108 may serve as an etching stop layer to prevent the etching process for removing an oxide layer 110 and a nitride layer 112 from affecting the layers below the second passivation layer 108, e.g., the first passivation layer 106 and the pad layer 104. In some embodiments, the material of the second passivation layer 108 may be different from the material of the first passivation layer 106 and also different from the material of the oxide layer 110 that is located above the second passivation layer 108. In addition, in some embodiments, the material of the second passivation layer 108 and the material of the oxide layer 110 may have different etch selectivity ratios. Specifically, in some embodiments, the material of the second passivation layer 108 may include polycrystalline silicon.

Moreover, the second passivation layer 108 may have a thickness $T_3$. In some embodiments, the thickness $T_3$ of the second passivation layer 108 may be in a range from about 20 nm to about 100 nm, or from about 30 nm to about 60 nm, e.g., about 40 nm, or about 50 nm. In some embodiments, the thickness $T_3$ of the second passivation layer 108 may be substantially the same as the thickness $T_2$ of the first passivation layer 106. In addition, it should be understood that if the thickness $T_3$ of the second passivation layer 108 is too small (for example, less than 20 nm), the second passivation layer 108 may not effectively serve as an etch stop layer. On the other hand, if the thickness $T_3$ of the second passivation layer 108 is too large (for example, greater than 100 nm), it may lead to increased process costs.

It is worth noting that the second passivation layer 108 may be formed of a particular material and may have a particular thickness, and may be subsequently removed by a particular etching process. Therefore, it may be effectively serve as an etch stop layer and the problem of corrosion of the pad layer 104 that results from the reaction between the Chemical substances (e.g. halogen substances), which are left in the etching process for removing the oxide layer 110 and the nitride layer 112, and the pad layer 104 may be reduced. Details of the process for removing the second passivation layer 108 will be described below.

Next, the oxide layer 110 may be formed on the second passivation layer 108. In some embodiments, the material of the oxide layer 110 may include silicon oxide, but is not limited thereto. In some embodiments, the material of the oxide layer 110 may be silicon oxide formed by a high density plasma (HDP) chemical vapor deposition (CVD) process.

Furthermore, the oxide layer 110 may have a thickness $T_4$. In some embodiments, the thickness $T_4$ of the oxide layer 110 may be in a range from about 800 nm to about 1400 nm, or from about 900 nm to about 1200 nm, e.g., about 1000 nm or about 1100 nm.

As shown in FIG. 1A, the nitride layer 112 may be formed on the oxide layer 110. In some embodiments, the material of the nitride layer 112 may include a nitride, such as silicon nitride, silicon oxynitride, or a combination thereof, but it is not limited thereto.

Furthermore, the nitride layer 112 may have a thickness $T_5$. In some embodiments, the thickness $T_5$ of the nitride layer 112 may be in a range from about 400 nm to about 800 nm, or from about 500 nm to about 700 nm, e.g., about 600 nm.

In some embodiments, a chemical vapor deposition (CVD) process, a physical vapor deposition (PVD) process, an electroplating process, an electroless plating process, a spin on coating process, a thermal oxidation process, other suitable processes, or a combination thereof may be used to form the semiconductor substrate 102, the pad layer 104, the first passivation layer 106, the second passivation layer 108, the oxide layer 110, and the nitride layer 112 described above.

Figure 1B:
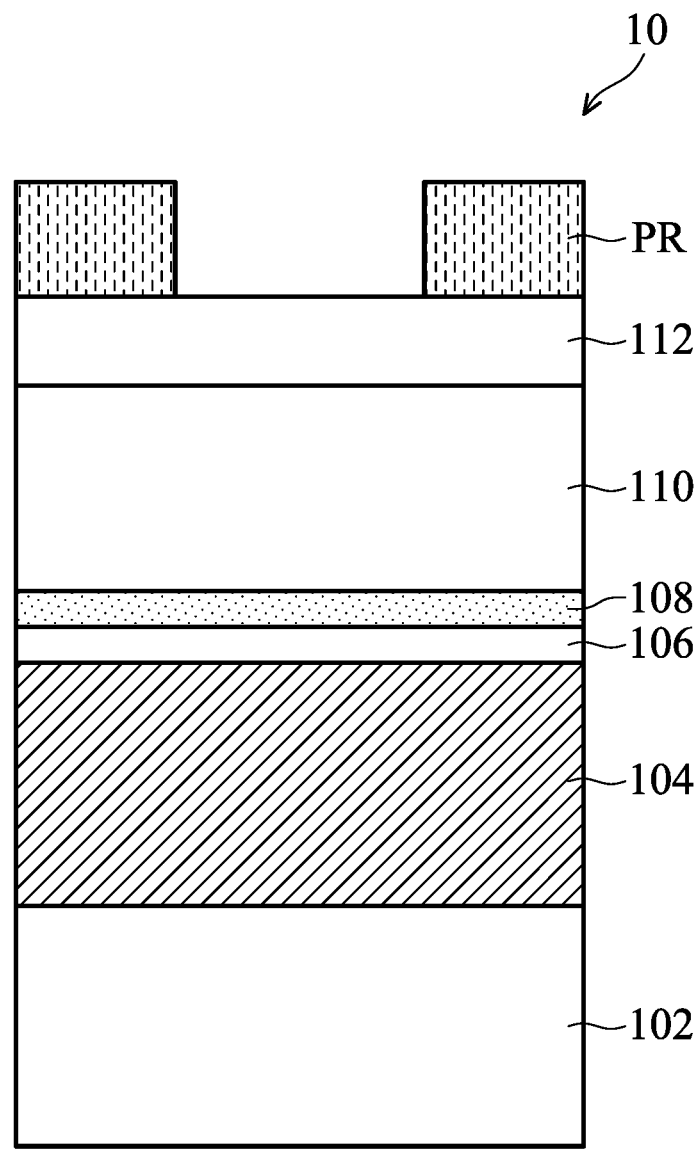

Next, referring to FIG. 1B, a mask layer PR may be formed on the nitride layer 112 to define the position of an opening 202 that is subsequently to be formed in the oxide layer 110 and the nitride layer 112. In some embodiments, the mask layer PR may include a photoresist material.

Figure 1C:
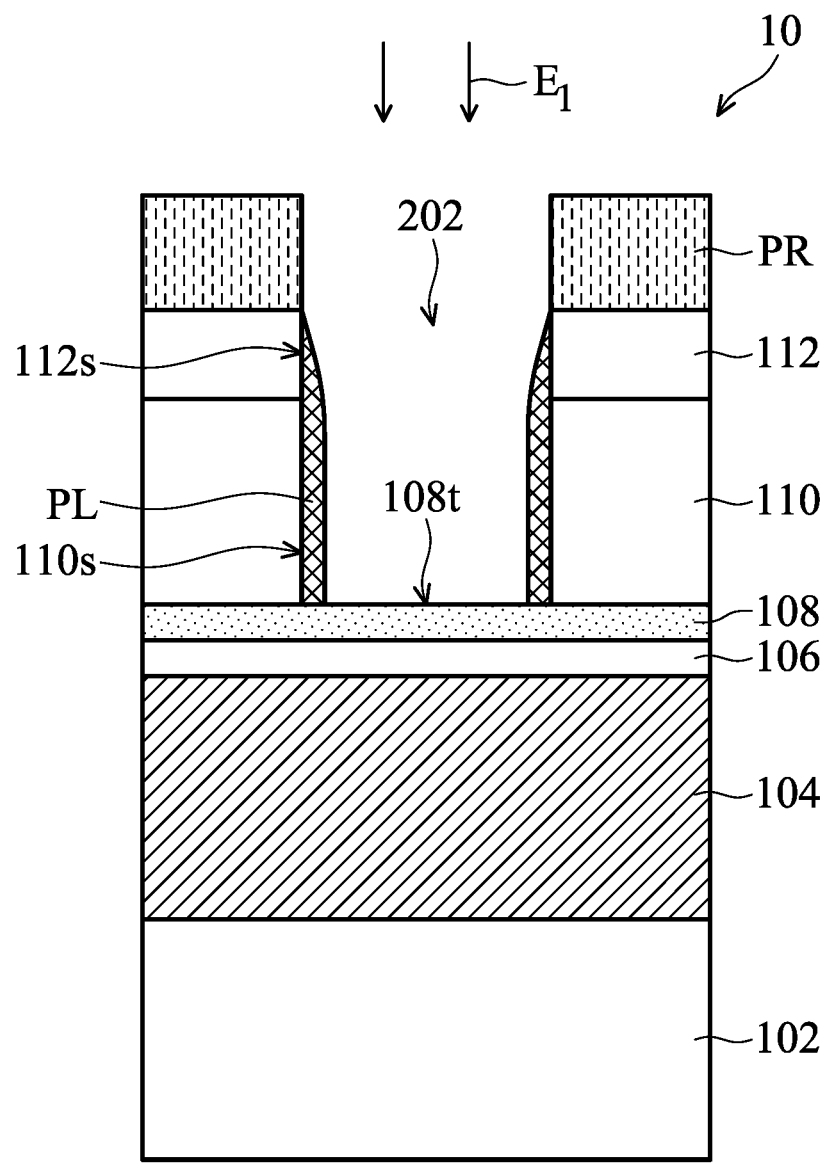

Next, referring to FIG. 1C, a portion of the oxide layer 110 and a portion of the nitride layer 112 may be removed to expose a portion of the second passivation layer 108. Specifically, in some embodiments, the patterned mask layer PR may be used as a mask, and the oxide layer 110 and the nitride layer 112 that are not covered by the mask layer PR may be removed to form the opening 202 that penetrates the oxide layer 110 and nitride layer 112. In addition, the opening 202 may expose a portion of a top surface 108t of the second passivation layer 108.

Furthermore, in some embodiments, the step of removing a portion of the oxide layer 110 and a portion of the nitride layer 112 may be performed using a first etching process $E_1$. The first etching process $E_1$ may remove the oxide layer 110 and the nitride layer 112, and stop the etching at the position of the second passivation layer 108. That is, the first etching process $E_1$ does not remove the second passivation layer 108.

In some embodiments, the first etching process $E_1$ may be a dry etching process. For example, the first etching process $E_1$ may include a reactive-ion etching (RIE) process, a plasma etching process, or a combination thereof. In some embodiments, the first etching process $E_1$ may include using a first etching gas, and the first etching gas may include tetrafluoromethane ($CF_4$).

In addition, as shown in FIG. 1C, in some embodiments, the first etching process $E_1$ may generate a polymer by-product PL on the sidewalls 110s of the oxide layer 110 and the sidewall 112s of the nitride layer 112. It should be understood that although it is not shown in the FIGURE, the polymer by-product PL may also exist on the top surface 108t of the second passivation layer 108. Specifically, the first etching gas may chemically react with the mask layer PR, the oxide layer 110, the nitride layer 112, and the second passivation layer 108, etc., and the polymer by-product PL that is not easily removed may be generated in the opening 202.

Figure 1D:
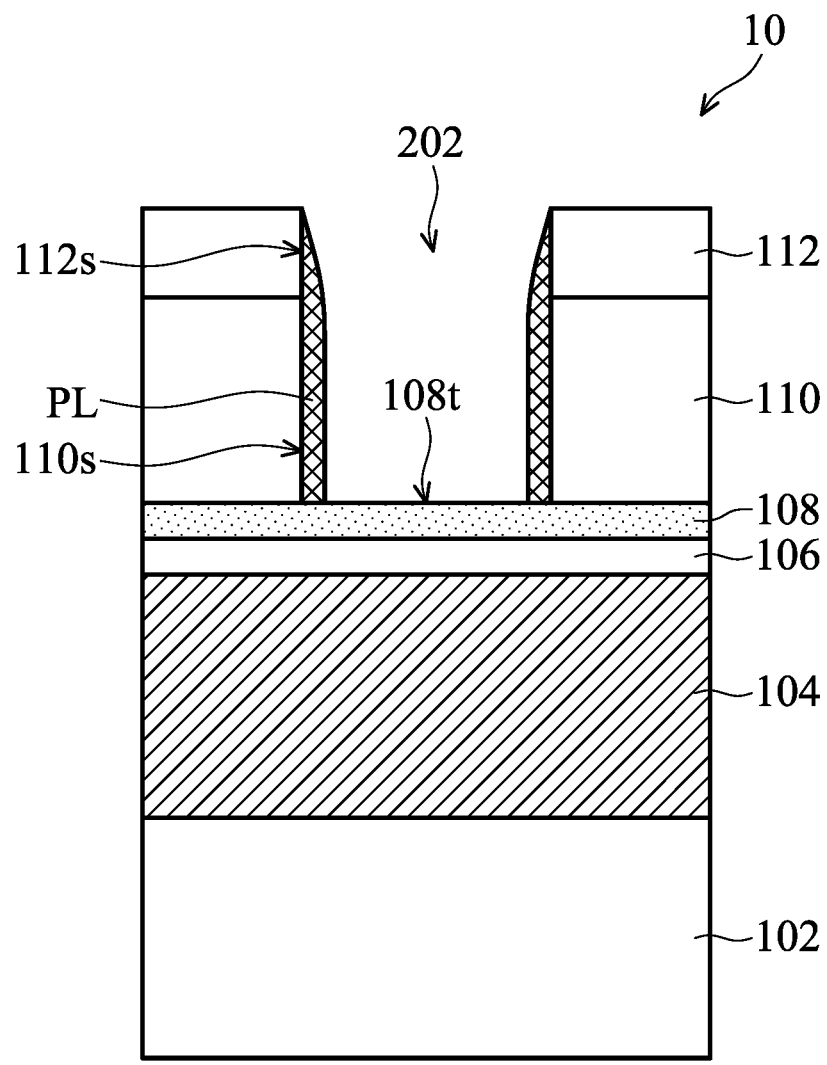

Next, referring to FIG. 1D, in some embodiments, after removing the portion of the oxide layer 110 and the portion of the nitride layer 112, the patterned mask layer PR may be removed. In some embodiments, the mask layer PR may be removed by a wet stripping process, a plasma ashing process, or a combination thereof.

Figure 1E:
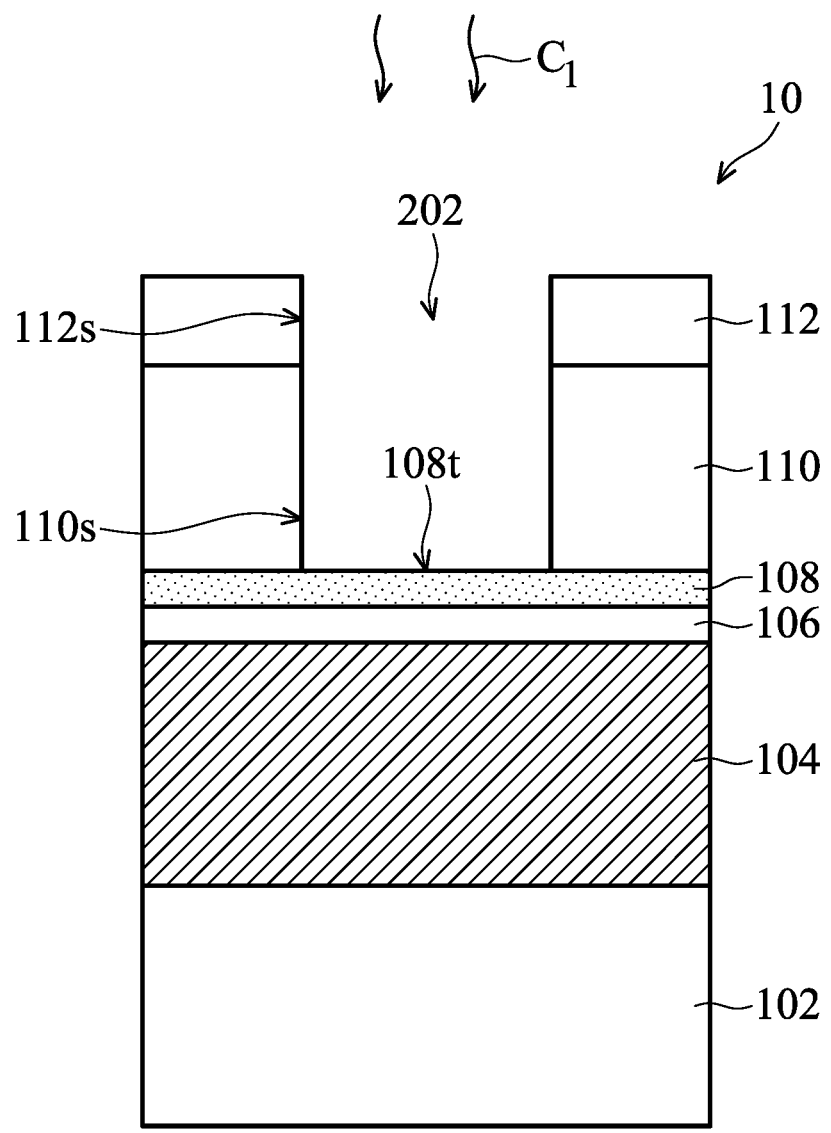

Next, referring to FIG. 1E, in some embodiments, after removing the patterned mask layer PR, the polymer by-product PL may be removed using a cleaning process $C_1$. In some embodiments, the cleaning process $C_1$ may include using an alkaline solution to remove the polymer by-product PL. In some embodiments, the alkaline solution may be a strong alkaline solution.

Figure 1F:
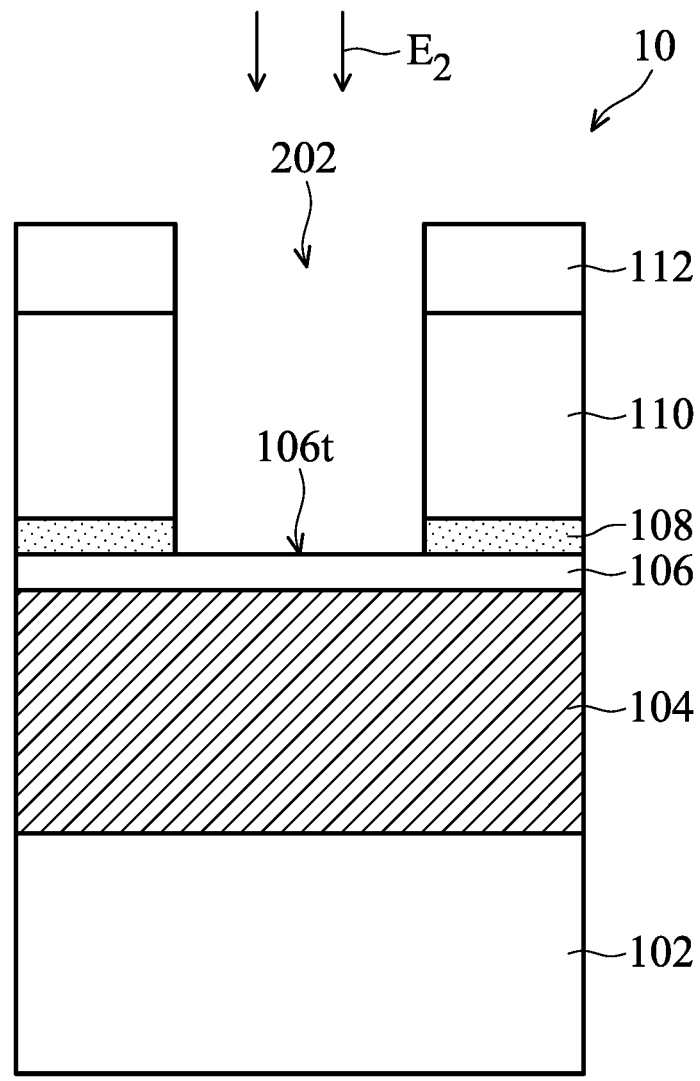

Next, referring to FIG. 1F, a portion of the second passivation layer 108 that has been exposed may be removed to expose a portion of the first passivation layer 106, for example, a top surface 106t of the first passivation layer 106 may be exposed. Specifically, in some embodiments, removing the portion of the second passivation layer 106 that has been exposed may be performed using a second etching process $E_2$.

In some embodiments, the second etching process $E_2$ may be a dry etching process. For example, the second etching process $E_2$ may include a reactive ion etching process, a plasma etching process, or a combination thereof. In some embodiments, the second etching process $E_2$ may include using a second etching gas, and the second etching gas may include hydrogen bromide (HBr). In some embodiments, the second etching gas may optionally include a chloride. In some embodiments, the second etching gas may optionally include chlorine ($Cl_2$). In some embodiments where the second etching gas includes hydrogen bromide and chlorine, the ratio of hydrogen bromide to chlorine may be about 10:2, or about 10:1. In addition, it should be noted that the second etching gas does not include tetrafluoromethane ($CF_4$), and therefore, there is less problem of corrosion of the pad layer 104 due to residual fluorine.

In another embodiment, the second etching process $E_2$ may include using aqueous ammonia ($NH_4OH$) to remove the second passivation layer 108 that has been exposed to expose the first passivation layer 106.

Figure 1G:
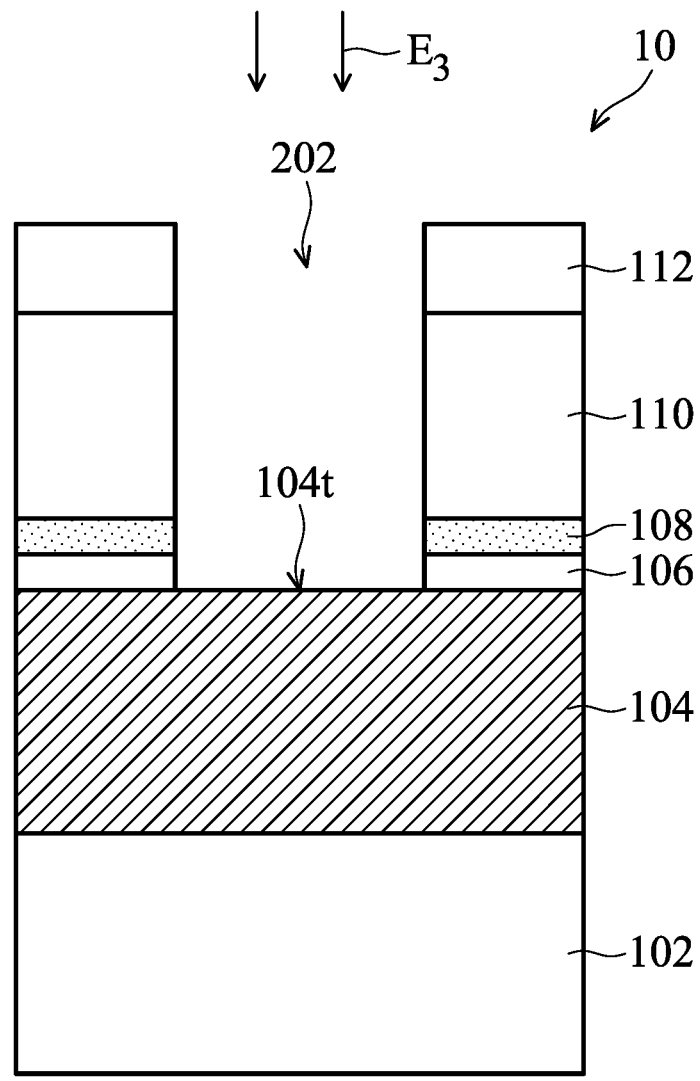

Next, referring to FIG. 1G, a portion of the first passivation layer 106 that has been exposed may be removed to expose a portion of the pad layer 104, for example, a top surface 104t of the pad layer 104 may be exposed. Specifically, in some embodiments, removing the portion of the first passivation layer 106 that has been exposed may be performed using a third etching process $E_3$.

In some embodiments, the third etching process $E_3$ may be a dry etching process. For example, the third etching process $E_3$ may include a reactive ion etching process, a plasma etching process, or a combination thereof. In some embodiments, the third etching process $E_3$ may include using a third etching gas, and the third etching gas may include chlorine ($Cl_2$) and the third etching gas may not include tetrafluoromethane ($CF_4$).

It should be understood that although the second etching process $E_2$ and the third etching process $E_3$ are two separate steps in the embodiments described above, the second etching process $E_2$ and the third etching process $E_3$ may be performed in the same step in accordance with some other embodiments. That is, the first passivation layer 106 and the second passivation layer 108 may be removed simultaneously. For example, in some embodiments, the etching gas including both hydrogen bromide and chlorine may be used, and a suitable ratio of hydrogen bromide and chlorine may be used to remove the first passivation layer 106 and the second passivation layer 108 simultaneously.

In addition, in some embodiments, after the first passivation layer 106 is removed to expose the pad layer 104, the chlorine that is left in the third etching process $E_3$ may be removed using a cleaning process (not labeled in the FIGURE), and this cleaning process may be performed in situ. Specifically, the cleaning process and the third etching process $E_3$ may be performed in the same chamber, and the top surface 104t of the pad layer 104 may be rinsed with water without breaking the vacuum. The chlorine that is left therefore may be removed and corrosion of the pad layer 104 may be prevented.

As shown in FIG. 1G, the semiconductor device 10 that is formed at this stage may include the semiconductor substrate 102, the pad layer 104, the first passivation layer 106, the second passivation layer 108, and the oxide layer 110. The pad layer 104 may be disposed on the semiconductor substrate 102. The first passivation layer 106 may be disposed on the pad layer 104. The second passivation layer 108 may be disposed on the first passivation layer 106. The oxide layer 110 may be disposed on the second passivation layer 108. The nitride layer 112 may be disposed on the oxide layer 110. In addition, the semiconductor device 10 may include the opening 202 that penetrates the first passivation layer 106, the second passivation layer 108, the oxide layer 110 and the nitride layer 112, and exposes the top surface 104t of the pad layer 104.

As described above, in accordance with some embodiments, the pad layer 104 may serve as the top metal layer of the semiconductor device 10, and may be continuously exposed to the environment until the packaging process is completed, and then may be further coupled to suitable external electronic components, but the present disclosure is not limited thereto. In accordance with some embodiments, the method for forming the semiconductor device provided in the present disclosure may also be applied to a process of forming a via of a contact structure.

To summarize the above, in accordance with some embodiments of the present disclosure, the method for forming the semiconductor device includes forming the second passivation layer including polycrystalline silicon on the pad layer, and the second passivation layer can be used as the etch stop layer. Furthermore, in accordance with some embodiments of the present disclosure, the etching process for removing the first passivation layer and the second passivation layer does not use the fluorine-containing gas (e.g., tetrafluoromethane ($CF_4$)), and the method further includes the cleaning process that is performed in-situ with this etching process. Accordingly, the problem of corrosion of the pad layer that results from the reaction between the chemical substances left in the etching process and the pad layer can be reduced, and therefore the yield of the pad layer can be effectively improved, e.g., the quality of electrical connection can be improved.

Although some embodiments of the present disclosure and their advantages have been described in detail, it should be understood that various changes, substitutions and alterations can be made herein without departing from the spirit and scope of the disclosure as defined by the appended claims. The scope of protection of present disclosure is subject to the definition of the scope of the appended claims.

What is claimed is:

1. A method for forming a semiconductor device, including:
   providing a semiconductor substrate;
   forming a pad layer on the semiconductor substrate;
   forming a first passivation layer on the pad layer;
   forming a second passivation layer on the first passivation layer, wherein the second passivation layer comprises polycrystalline silicon;
   forming an oxide layer on the second passivation layer;
   forming a nitride layer on the oxide layer;
   removing a portion of the oxide layer and a portion of the nitride layer to expose a portion of the second passivation layer;
   removing the portion of the second passivation layer that has been exposed to expose a portion of the first passivation layer; and
   removing the portion of the first passivation layer that has been exposed to expose a portion of the pad layer,
   wherein the step of removing the portion of the first passivation layer that has been exposed is performed using a third etching process, the third etching process comprises using a third etching gas, and the third etching gas comprises chlorine ($Cl_2$).

2. The method for forming a semiconductor device as claimed in claim 1, wherein the step of removing the portion of the oxide layer and the portion of the nitride layer is performed using a first etching process, the first etching process comprises using a first etching gas, and the first etching gas comprises tetrafluoromethane ($CF_4$).

3. The method for forming a semiconductor device as claimed in claim 2, wherein the first etching process generates a polymer by-product on sidewalls of the oxide layer and the nitride layer.

4. The method for forming a semiconductor device as claimed in claim 3, further comprising:
   removing the polymer by-product using a cleaning process, wherein the cleaning process comprises using an alkaline solution.

5. The method for forming a semiconductor device as claimed in claim 2, wherein the first etching process does not remove the second passivation layer.

6. The method for forming a semiconductor device as claimed in claim 1, wherein the step of removing the portion of the second passivation layer that has been exposed is performed using a second etching process, the second etching process comprises using a second etching gas, and the second etching gas comprises hydrogen bromide (HBr).

7. The method for forming a semiconductor device as claimed in claim 6, wherein the second etching gas does not comprise tetrafluoromethane ($CF_4$).

8. The method for forming a semiconductor device as claimed in claim 6, wherein the second etching gas further comprises a chloride.

9. The method for forming a semiconductor device as claimed in claim 8, wherein the chloride comprises chlorine ($Cl_2$).

10. The method for forming a semiconductor device as claimed in claim 9, wherein the ratio of hydrogen bromide to chlorine is 10:2.

11. The method for forming a semiconductor device as claimed in claim 6, wherein the second etching process comprises using aqueous ammonia ($NH_4OH$).

12. The method for forming a semiconductor device as claimed in claim 1, wherein the third etching gas does not comprise tetrafluoromethane ($CF_4$).

13. The method for forming a semiconductor device as claimed in claim 1, further comprising:
   removing the chlorine that is left in the third etching process using a cleaning process, wherein the cleaning process is performed in situ.

14. The method for forming a semiconductor device as claimed in claim 1, wherein a thickness of the second passivation layer is in a range from 20 nm to 100 nm.

* * * * *